United States Patent
Ryu et al.

(10) Patent No.: US 8,337,046 B2
(45) Date of Patent: Dec. 25, 2012

(54) LUMINOUS ELEMENT FOR BACKLIGHT UNIT

(75) Inventors: Seung Ryeol Ryu, Ansan (KR); Seok Jin Kang, Ansan (KR)

(73) Assignee: Seoul Semiconductor Co., Ltd., Seoul (KR)

( * ) Notice: Subject to any disclaimer, the term of this patent is extended or adjusted under 35 U.S.C. 154(b) by 644 days.

(21) Appl. No.: 12/094,015

(22) PCT Filed: Nov. 17, 2006

(86) PCT No.: PCT/KR2006/004859
§ 371 (c)(1),
(2), (4) Date: May 16, 2008

(87) PCT Pub. No.: WO2007/058501
PCT Pub. Date: May 24, 2007

(65) Prior Publication Data
US 2008/0278947 A1   Nov. 13, 2008

(30) Foreign Application Priority Data
Nov. 18, 2005   (KR) .................... 10-2005-0110713

(51) Int. Cl.
*F21S 4/00* (2006.01)
*F21V 1/00* (2006.01)

(52) U.S. Cl. ............. 362/249.02; 362/222; 362/217.02; 362/217.11; 362/217.15; 362/612

(58) Field of Classification Search ............. 362/249.02, 362/311.02–311.04, 223–224, 217.02, 217.1–217.11, 362/217.14–217.15, 612
See application file for complete search history.

(56) References Cited

U.S. PATENT DOCUMENTS

| | | | | |
|---|---|---|---|---|
| 4,742,432 A | * | 5/1988 | Thillays et al. | 361/783 |
| 5,032,960 A | * | 7/1991 | Katoh | 362/240 |
| 5,803,573 A | * | 9/1998 | Osawa et al. | 362/612 |
| 7,157,853 B2 | * | 1/2007 | Imai et al. | 313/512 |
| 2002/0089849 A1 | * | 7/2002 | Lamke et al. | 362/241 |

FOREIGN PATENT DOCUMENTS

| | | |
|---|---|---|
| JP | 2-215171 | 8/1990 |
| JP | 7-015045 | 1/1995 |
| JP | 9-102633 | 4/1997 |
| JP | 2000-156525 | 6/2000 |
| JP | 2001-326389 | 11/2001 |
| JP | 2002-163915 | 6/2002 |
| JP | 2004-354534 | 12/2004 |
| KR | 10-2002-0081812 | 10/2002 |
| KR | 10-2003-0081975 | 10/2003 |
| KR | 10-2005-0105838 | 11/2005 |

* cited by examiner

*Primary Examiner* — Sean Gramling
(74) *Attorney, Agent, or Firm* — H.C. Park & Associates, PLC

(57) ABSTRACT

The present invention relates to a luminous element, and more particularly, to a luminous element for a backlight unit with a plurality of luminous chips mounted on a substrate. The present invention provides a luminous element for a backlight unit, in which luminous chips are arranged on a substrate so that the manufacturing process and cost can be reduced and the size of a substrate is minimized when manufacturing the luminous element, thereby minimizing the size of a backlight unit. Further, the present invention provides a luminous element for a backlight unit, in which luminance uniformity can be increased by optimizing the viewing angle of the luminous element.

8 Claims, 1 Drawing Sheet

US 8,337,046 B2

LUMINOUS ELEMENT FOR BACKLIGHT UNIT

CROSS REFERENCE RELATED APPLICATIONS

This application is the National Stage of International Application No. PCT/KR2006/004859, filed Nov. 17, 2006, and claims priority from and the benefit of Korean Patent Application No. 10-2005-0110713, filed on Nov. 18, 2005, which are both hereby incorporated by reference for all purposes as if fully set forth herein.

BACKGROUND OF THE INVENTION

1. Field of the Invention

The present invention relates to a luminous element, and more particularly, to a luminous element for a backlight unit with a plurality of luminous chips mounted on a substrate.

2. Discussion of the Background

In general, the application range of a liquid crystal displays (LCD) has extended because of its lightweight, thin, low-power drive, full color and high resolution characteristics. A liquid crystal display has been currently used in a computer, notebook computer, PDA, telephone, TV, audio/video device or the like. In such a liquid crystal display, transmitted amount of light is controlled in accordance with image signals applied to a number of control switches arrayed in a matrix form and then a desired image is displayed on a liquid crystal display panel.

Since the liquid crystal display cannot emit light by itself, it requires a light source such as a backlight unit. Such a backlight for a liquid crystal display there are two kinds of illuminating type which are edge light and direct light types depending on a position of a light source.

The edge light type is a type in which a light source is mounted at an edge of a liquid crystal display panel such that light produced from the light source is emitted to the liquid crystal display panel through a light guide plate positioned below the liquid crystal display panel. The edge light type has superior uniformity of light, is advantageous in manufacturing thin liquid crystal displays, and is generally used to supply light in medium- and small-sized liquid crystal display panels. Meanwhile, the direct light type is a type in which a plurality of light sources are positioned below a liquid crystal display panel such that light is emitted directly to an entire surface of the liquid crystal display panel. The direct light type can secure high luminance and is generally used to supply light in medium- and large-sized liquid crystal display panels.

At this time, an electroluminescent lamp (EL), a light emitting diode (LED), a cold cathode fluorescent lamp (CCFL) or the like is used as a light source of the backlight unit.

Here, in an edge light type backlight unit using light emitting diodes according to a prior art, a plurality of side luminous elements are separately manufactured and mounted to a substrate such as a flexible printed circuit board (FPCB), FR-4 or metal core printed circuit board (MCPCB).

However, in the aforementioned conventional structure, an assembling process is complicated and difficult, and the processing time and cost are required to mount the separately manufactured luminous elements on a substrate. That is, since a substrate having luminous chips mounted thereon and the luminous element including the luminous chips mounted on the substrate should be arranged on a separately prepared circuit board, the cost caused from the addition of the circuit board is increased. Further, the additional circuit board requires a space for positioning the luminous elements. Accordingly, there is a problem in that the entire size of a backlight unit is increased.

SUMMARY OF THE INVENTION

The present invention is conceived to solve the aforementioned problems. Accordingly, an object of the present invention is to provide a luminous element for a backlight unit, in which luminous chips are arranged on a substrate so that manufacturing time and cost can be reduced.

Another object of the present invention is to provide a luminous element for a backlight unit, in which the size of a backlight unit can be minimized by minimizing the size of a substrate when manufacturing the luminous element A further object of the present invention is to provide a luminous element for a backlight unit, in which the viewing angle of the luminous element is optimized thus to increase the luminance uniformity of a liquid crystal display.

According to an aspect of the present invention for achieving the objects, there is provided a luminous element for a backlight unit, comprising a substrate; a plurality of electrodes formed on the substrate to be spaced apart from one another; a plurality of luminous chips respectively mounted on the plurality of electrodes to be connected electrically to one another; a molding portion for encapsulating the plurality of luminous chips; and a case for accommodating the substrate and having a top portion opened, wherein an upper end of the case protrudes in a region on which the luminous chip is mounted to cover at least a portion of light emitted from the luminous chip.

At this time, the molding portion may comprise a base molding portion formed to be flat on an entire top surface of the substrate, and a lens molding portion protruding in correspondence with the upper end of the case at the region on which the luminous chip is mounted. Also, a cross section of the lens molding portion in a longitudinal direction of the case is preferably in the shape of a semicircle.

Further, a hole may be formed to be vertically bored through the substrate, and one of the electrodes may be formed to extend to a bottom surface of the substrate through the hole. At this time, the luminous element may further comprise a connector connected to the electrode formed to extend to the bottom surface of the substrate to apply external power.

Furthermore, the plurality of luminous chips are connected in series to one another in a longitudinal direction of the case.

As described above, the present invention provides a luminous element for a backlight unit, in which luminous chips are arranged on a substrate so that the manufacturing process and cost can be reduced and the size of a substrate is minimized when manufacturing the luminous element, thereby minimizing the size of a backlight unit.

Further, the present invention provides a luminous element for a backlight unit, in which luminance uniformity can be increased by optimizing the viewing angle of the luminous element.

DETAILED DESCRIPTION OF THE ILLUSTRATED EMBODIMENTS

Figure 1:
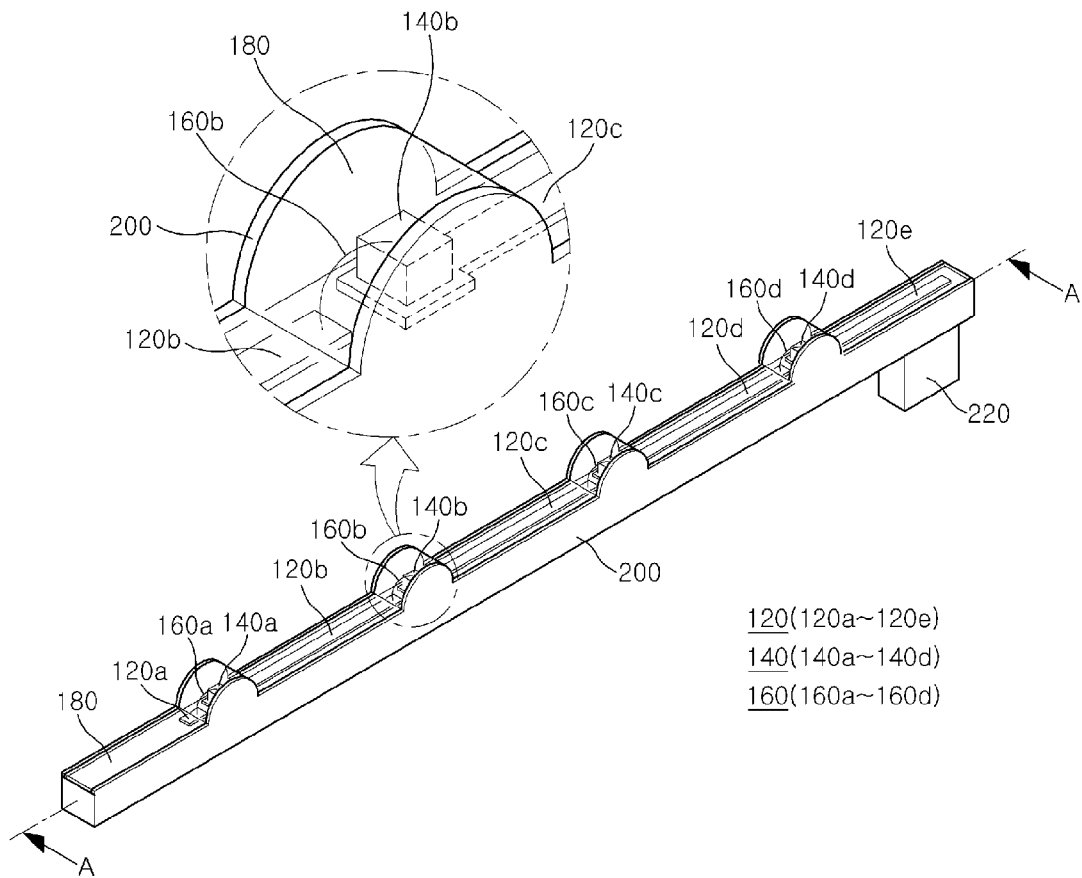
FIG. 1 is a perspective view of a luminous element for a backlight unit according to the present invention.

Hereinafter, a preferred embodiment of the present invention will be described in detail with reference to the accompanying drawings.

However, the present invention is not limited to the embodiment disclosed herein but may be embodied in different forms. The embodiment is provided only for illustrative purposes and for full understanding of the scope of the present invention by those skilled in the art. Throughout the drawings, like reference numerals are used to designate like elements.

Figure 2:
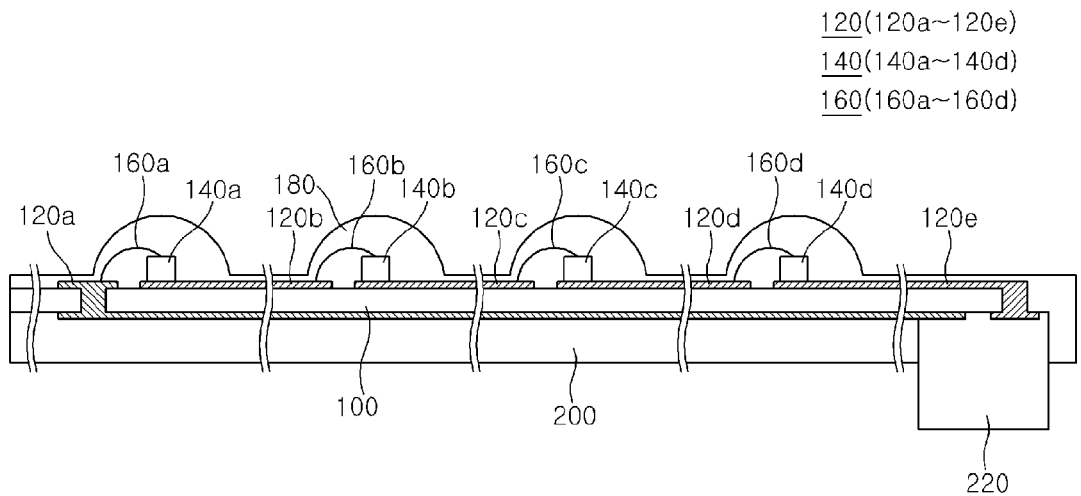
FIG. 2 is a sectional view taken along line A-A in FIG. 1.

FIG. 1 is a perspective view of a luminous element for a backlight unit according to the present invention, and FIG. 2 is a sectional view taken along line A-A in FIG. 1.

The luminous element for a backlight unit according to the present invention will be described with reference to FIGS. 1 and 2. The luminous element for a backlight unit includes a substrate 100, an electrode pattern 120 formed on top and bottom surfaces of the substrate 100, luminous chips 140 mounted on the electrode pattern 120, and wires 160 through which the luminous chips 140 and the electrode pattern 120 is connected. At this time, the luminous element for a backlight unit may include a molding portion 180 encapsulating the luminous chips 140 and the wires 160. Further, the luminous element for a backlight unit may include a connector 220 for receiving external power from a bottom of the substrate 100 and a case 200 extending in one direction to protect and accommodate the luminous chips 140, the wires 160, the substrate 100 and the molding portion 180.

The substrate 100 is a thin insulative plate on which the electrode pattern 120 for supporting the luminous chips 140 and applying external power thereto is formed. The electrode pattern 120 is formed on the top and bottom surfaces of the substrate 100 of the present invention. Further, holes are formed to be vertically bored through the substrate 100 in order to electrically connect the electrode pattern 120 formed on the top and bottom surfaces thereof.

The electrode pattern 120 formed on the top and bottom surfaces of the substrate 100 in order to apply the external power to the luminous chips 140, includes first to fifth electrodes 120a to 120e. At this time, the first to fifth electrodes 120a to 120e are formed to be spaced apart from one another at predetermined intervals.

Meanwhile, the first and fifth electrodes 120a and 120e are formed such that power can be received from the bottom of the substrate 100 by plating an inner peripheral surface of the holes formed to be vertically bored through the substrate 100 or filling the holes with a conductive material. That is, one side of the first electrode 120a is formed on the top surface of the substrate 100, and the other side of the first electrode 120a is formed on the bottom surface of the substrate 100 to extend to a position at which the connector 220 will be mounted, e.g., at which the fifth electrode 120e is formed so that the other side of the first electrode 120a is easily connected to the connector 220 on the bottom surface of the substrate 100. At this time, both the sides of the first electrode 120a are connected to each other through the conductive material formed in the hole vertically bored through the substrate 100. Further, one side of the fifth electrode 120e is formed on the top surface of the substrate 100, and the other side of the fifth electrode 120e is formed on the bottom surface of the substrate 100 and connected to the one side through the hole vertically bored through the substrate 100.

The second to fourth electrodes 120b to 120d and the one sides of the first and fifth electrodes 120a and 120e are formed on the top surface of the substrate 100, and first to fourth luminous chips 140a to 140d are mounted on the second to fifth electrodes 120b to 120e, respectively. That is, the first luminous chip 140a is mounted on the second electrode 120b, and the second luminous chip 140b is mounted on the third electrode 120c. Further, the third luminous chip 140c is mounted on the fourth electrode 120d, and the fourth luminous chip 140d is mounted on one end of the fifth electrode 120e. At this time, the first to fourth luminous chips 140a to 140d are connected to the other end of first to fourth electrodes 120a to 120d through the wires 160, respectively, so that the first to fourth luminous chips 140a to 140d can be connected to each other in series. However, the present invention is not limited thereto. That is, a plurality of luminous chips are mounted on the second to fifth electrodes 120b to 120e such that the plurality of luminous chips can be connected to one another in parallel. Further, although the first to fourth luminous chips 140a to 140d as the luminous chips and the second to fifth electrodes 120b to 120e as an electrode pattern for mounting the first to fourth luminous chips 140a to 140d thereon, i.e., four luminous chips and four electrodes, are used in this embodiment, but the present invention is not limited thereto. That is, the number of the electrodes of the electrode pattern 120 and the luminous chips 140 may be larger or smaller than four.

The wires 160 formed of metal with superior ductility and conductivity, such as Au or Al, are to apply external power supplied up to the electrode 120 to the luminous chips 140. Further, the wires 160 include first to fourth wires 160a to 160d. One ends of the wires 160 is connected to the electrode pattern 120, and the other end thereof is connected to an upper electrode of the luminous chips 140.

That is, one end of the first wire 160a is connected to the first electrode 120a formed on the top surface of the substrate 100, and the other end thereof is connected to an upper electrode of the first luminous chip 140a mounted on the one end of the second electrode 120b. One end of the second wire 160b is connected to the other end of the second electrode 120b with the first luminous chip 140a mounted thereon, and the other end thereof is connected to an upper electrode of the second luminous chip 140b mounted on the one end of the third electrode 120c. Further, one end of the third wire 160c is connected to the other end of the third electrode 120c with the second luminous chip 140b mounted thereon, and the other end thereof is connected to an upper electrode of the third luminous chip 140c mounted on the one end of the fourth electrode 120d. Furthermore, one end of the fourth wire 160d is connected to the other end of the fourth electrode 120d with the third luminous chip 140c mounted thereon, and the other end thereof is connected to an upper electrode of the fourth luminous chip 140d mounted on the one end of the fifth electrode 120e.

In a conventional luminous element for a backlight unit, a plurality of luminous elements, each of which has luminous chips mounted on a substrate, are separately manufactured and then mounted on a substrate. However, in the present invention, the plurality of luminous chips 140 are mounted on the substrate 100 and then manufactured as a single luminous element as described above, so that an assembling process is simplified and easy, and the processing time for manufacturing the luminous element is also reduced. Therefore, the processing cost for mounting a plurality of conventional luminous elements disappears, and the cost caused from the addition of a circuit board for mounting luminous elements thereon is also reduced because there is required only a substrate on which luminous chips will be mounted. Furthermore, since an electrode is formed directly on a substrate on which luminous chips will be mounted and the luminous chips are mounted on the electrode, the luminous element with an optimized size can be manufactured.

Meanwhile, the luminous chip 140 is a vertical type luminous chip with electrodes formed on a top and a bottom thereof. The luminous chip 140 generally includes a first nitride semiconductor layer, an active layer formed on the first nitride semiconductor layer, and a second nitride semiconductor layer formed on the active layer. The luminous chip 140 emits light by means of an external power source. Further, the luminous chip 140 includes the first to fourth luminous chips 140a to 140d, which are mounted on the electrode pattern 120 in a line. However, the present invention is not limited thereto, but may use a horizontal type luminous chip having electrodes formed on the surfaces facing the same direction instead of the vertical type luminous chip 140. At this time, it is preferred that an insulation be formed between the horizontal type luminous chip and the electrode pattern 120. The horizontal type luminous chip and the electrode pattern 120 may be connected through a two-tap wire structure using two wires. However in consideration of the convenience of process and the manufacturing cost, it is preferable to use a vertical type luminous chip and a one-tap wire structure in which the vertical type luminous chip and the electrode pattern 120 are connected through a single wire. Further, although the luminous element for a backlight unit has the four luminous chips 140 in this embodiment, the present invention is not limited thereto. That is, the luminous element for a backlight unit may have more or less than the four luminous chips.

The molding portion 180 serves to protect the luminous chips 140 and the wires 160 and simultaneously functions as a lens. The molding portion 180 is generally formed of epoxy or silicone resin. In the present invention, the molding portion 180 includes a base molding portion formed in the shape of covering the luminous chips 140 and the wires 160 to be flat on the entire top surface of the substrate 100, and a lens molding portion formed to protrude in the shape of a lens on a region which each luminous chip 140 is mounted on. At this time, it is preferred that the lens molding portion be formed such that a cross section of the luminous element for a backlight unit in a major axis direction is in the shape of a semicircle, at the center of which the luminous chip is mounted. The viewing angle of the luminous chip 140 in the major axis direction is about 180 degrees due to such a shape of the molding portion. Therefore, light is uniformly spread throughout a light guide plate (not shown) so that a dark portion can be minimized.

The case 200 is in the shape of a rectangular hexahedron of which a top portion is opened. The case 200 is manufactured with insulative resin to protect the luminous chips 140, the wires 160, the substrate 100 and the molding portion 180 and to accommodate these components.

At this time, sidewalls of the case 200 protect the molding portion 180, the luminous chips 140 and the wires 160, and an upper end of the sidewall of the case 200 is formed to conform to the aforementioned molding portion 180. Accordingly, the viewing angle of light emitted from the luminous chip 140 in a minor axis direction can be identical with the width of the side surface of the light guide plate (not show), so that light loss can be minimized. To this end, it is preferred that the case be manufactured with opaque resin such that light cannot be transmitted through the case 200.

In addition, a bottom portion of the case 200 supports and protects the substrate 100, and supports the connector 220 to be mounted on the bottom surface of the substrate 100.

The connector 220 is used to apply the external power to the luminous chips 140, and electrically connected to the first and fifth electrodes 120a and 120e formed to be vertically bored through the substrate 100. At this time, a metal electrode is formed in the interior of the connector 220 to be connected to the first and fifth electrodes 120a and 120e, and a connector outer case is formed of insulative resin in the shape of surrounding the metal electrode in order to prevent a short circuit of the metal electrode and protect the metal electrode. Preferably, resin is not formed at a bottom portion of the connector 220, i.e., an opposite side to the substrate 100 with the connector 220 connected thereto, in order to connect an external terminal to the connector 220. Meanwhile, the connector 220 may be formed of the same material as the case 200. Further, an external case of the connector 220 is not separately formed but may be formed at a bottom portion of the case 200 integrally therewith.

Next, a method of manufacturing the aforementioned luminous element for a backlight unit according to the present invention will be briefly discussed.

In the luminous element for a backlight unit according to the present invention, a substrate 100 with an electrode pattern 120 formed on top and bottom surfaces thereof is first prepared. At this time, first to fifth electrodes 120a to 120e are formed on the top surface of the substrate 100 to be spaced apart from one another, and the first and fifth electrodes 120a and 120e are formed to extend to the bottom surface of the substrate 100 by filling the interior of holes formed to be vertically bored through the substrate 100 with a conductive material or by plating the inner peripheral surface of the holes.

Thereafter, first to fourth luminous chips 140a to 140d, which are separately manufactured, are mounted on the second to fifth electrodes 120b to 120e, respectively. Further, the luminous chips 140a to 140d and the first to fourth electrodes 120a to 120d are connected with first to fourth wires 160a to 160d through a wire bonding process, respectively.

That is, one end of the first wire 160a is connected to the first electrode 120a formed on the top surface of the substrate 100, and the other end thereof is connected to an upper electrode of the first luminous chip 140a mounted on one end of the second electrode 120b. One end of the second wire 160b is connected to the other end of the second electrode 120b with the first luminous chip 140a mounted thereon, and the other end thereof is connected to an upper electrode of the second luminous chip 140b mounted on one side of the third electrode 120c. Further, one end of the third wire 160c is connected to the other end of the third electrode 120c with the second luminous chip 140b mounted thereon, and the other end thereof is connected to an upper electrode of the third luminous chip 140c mounted on one end of the fourth electrode 120d. Furthermore, one end of the fourth wire 160d is connected to the other end of the fourth electrode 120d with the third luminous chip 140c mounted thereon, and the other end thereof is connected to an upper electrode of the fourth luminous chip 140d mounted on one end of the fifth electrode 120e.

Next, a separately manufactured connector 220 is connected to the first and fifth electrodes 120a and 120e formed on the bottom surface of the substrate 100, and a case 200 for accommodating the substrate 100 is formed.

That is, the case 200 is formed to have protruding portions at which the luminous chips 140 are mounted on the top surface of the substrate 100, and a certain amount of molding liquid, which is liquid silicone or epoxy resin, is injected into the entire space between side walls of the case 200. At this time, the molding liquid becomes a lens shape protruding at the regions on which the luminous chips 140 are mounted to conform to a shape of the upper portion of the case 200. A molding portion 180 encapsulating the luminous chips 140 and the wires 160 is formed by being left alone at a certain temperature for a certain period of time after the molding liquid has been injected, so that the luminous element for a backlight unit according to the present invention is completed.

Meanwhile, although in the aforementioned embodiment, the molding portion 180 is formed after the case 200 is formed, however, the present invention is not limited thereto. That is, the case 200 may be formed after the molding portion is formed.

The present invention is not limited to the aforementioned embodiments but defined by the appended claims. It will be understood by those skilled in the art that various changes and modifications can be made thereto within the technical spirit and scope defined by the appended claims.

The invention claimed is:

1. A luminous element for a backlight unit, comprising:
a substrate;
a plurality of electrodes formed on the substrate and spaced apart from one another;
a plurality of luminous chips respectively mounted on the plurality of electrodes to be connected electrically to one another;
a first vertical hole that penetrates the substrate, wherein one of the electrodes is formed to extend to a bottom surface of the substrate through the first vertical hole;
a molding portion to encapsulate the plurality of luminous chips; and
a case to accommodate the substrate and comprising flat sidewalls, a plurality of flat sidewall protrusions on each sidewall that extend in the plane of the respective sidewall away from the substrate, and an open top portion,
wherein the flat sidewall protrusions protrude on opposite sides of the case at an upper end of the case in respective regions on which the luminous chips are mounted to cover at least a portion of light emitted from the luminous chips emitted toward the flat sidewalls.

2. The luminous element as claimed in claim 1, wherein the molding portion comprises a base molding portion formed to be flat on an entire top surface of the substrate, and a lens molding portion protruding in correspondence with the upper end of the case at the region on which the luminous chip is mounted.

3. The luminous element as claimed in claim 2, wherein a cross section of the lens molding portion in a longitudinal direction of the case is in the shape of a semicircle.

4. The luminous element as claimed in claim 1, further comprising a connector connected to the electrode formed to extend to the bottom surface of the substrate to receive external power.

5. The luminous element as claimed in claim 1, wherein the plurality of luminous chips are connected in series to one another in a longitudinal direction of the case.

6. The luminous element as claimed in claim 4, further comprising:
a second vertical hole that penetrates the substrate; and
a chipless electrode with no luminous chip thereon formed on the substrate to extend to a bottom surface of the substrate through the second vertical hole and to be connected electrically to at least one of the plurality of luminous chips,
wherein the connector connects to the chipless electrode formed to extend to the bottom surface of the substrate through the second vertical hole.

7. A luminous element for a backlight unit, comprising:
a substrate of a rectangular hexahedron shape, wherein an upper surface is substantially rectangular, a bottom surface spaced apart from the upper surface by two longitudinal sides in a first direction and two transverse sides shorter than the longitudinal sides in a second direction;
a plurality of pattern electrodes disposed in the first direction on the upper surface spaced apart from one another, wherein at least one pattern electrode is electrically connected through a hole in the substrate to a pattern electrode portion disposed on the lower surface and at least one pattern electrode is not connected through a hole in the substrate to a pattern electrode portion disposed on the lower surface;
a plurality of luminous chips each comprising a first electrode and a second electrode, each luminous chip disposed on a corresponding pattern electrode and each first electrode electrically connected to the corresponding pattern electrode;
a plurality of wires to electrically connect to the second electrodes to electrically connect the luminous chips in one of series, parallel and a combination thereof;
a molding portion disposed on the entire upper surface to encapsulate the plurality of luminous chips and to cover the entire upper surface; and
a case comprising longitudinal sidewalls and transverse sidewalls to cover the corresponding longitudinal sides and the transverse sides of the of the substrate and the sidewalls defining an upper opening of the case,
wherein the longitudinal sidewalls comprise a plurality of corresponding protruding portions on opposite sides of the substrate that protrude only in the regions where the luminous chips are disposed to block light emitted from the luminous chips in the second direction,
wherein the molding portion comprises a lens portion that protrudes from the upper surface and fills the space between corresponding sidewall protruding portions.

8. A method of manufacturing a luminous element for a backlight unit, the method comprising:
forming electrode patterns on an upper surface of a substrate, wherein the electrode patterns are spaced apart from one another and at least one electrode pattern extends to a lower surface of the substrate through a vertical hole bored in the substrate and at least one electrode pattern does not extend to the lower surface;
mounting luminous chips on respective pattern electrodes on the upper surface by respective first electrodes of the luminous chips;
electrically connecting respective second electrodes of the luminous chips to adjacent corresponding pattern electrodes on the upper surface;
forming a case to accommodate the substrate, comprising:
forming sidewalls extending perpendicular to the upper and lower surfaces at a periphery of the substrate to define an upper opening exposing the luminous chips, and
forming a plurality of protruding flat sidewall portions on each sidewall that extend in the plane of the respective sidewall away from the substrate on two opposite sides of the substrate corresponding to each region of the luminous chips at the opening; and
molding a liquid to encapsulate the entire upper surface and the luminous chips when the liquid cures to a molding portion, wherein the molding portion completely fills a space between the sidewalls and between the protruding sidewall portions.

* * * * *